(12) United States Patent
Kenington (10) Patent No.: US 7,149,482 B2
(45) Date of Patent: Dec. 12, 2006

(54) COMPENSATION OF FILTERS IN RADIO TRANSMITTERS

(75) Inventor: Peter Blakeborough Kenington, Chepstow (GB)

(73) Assignee: Andrew Corporation, Westchester, IL (US)

( * ) Notice: Subject to any disclaimer, the term of this patent is extended or adjusted under 35 U.S.C. 154(b) by 435 days.

(21) Appl. No.: 10/663,100

(22) Filed: Sep. 16, 2003

(65) Prior Publication Data
US 2005/0059360 A1    Mar. 17, 2005

(51) Int. Cl.
    *H04B 1/02*    (2006.01)
(52) U.S. Cl. ............... 455/91; 455/126; 455/114.2; 455/115.1
(58) Field of Classification Search ............ 455/91, 455/114.2, 120, 115.1, 125, 116, 76, 114.1, 455/126, 119, 115.4
    See application file for complete search history.

(56) References Cited

U.S. PATENT DOCUMENTS

| | | | | |
|---|---|---|---|---|
| 3,891,926 A | * | 6/1975 | Ishman et al. | 455/108 |
| 5,058,130 A | | 10/1991 | Park | 375/12 |
| 6,041,083 A | * | 3/2000 | Larsson et al. | 455/115.1 |
| 6,591,090 B1 | * | 7/2003 | Vuorio et al. | 455/91 |
| 6,853,836 B1 | * | 2/2005 | Asam et al. | 455/126 |
| 6,968,163 B1 | * | 11/2005 | Kuechler et al. | 455/115.1 |
| 6,973,138 B1 | * | 12/2005 | Wright | 455/114.3 |
| 2001/0026196 A1 | * | 10/2001 | Delano | 455/120 |
| 2002/0160731 A1 | * | 10/2002 | Hashimoto et al. | 455/127 |
| 2003/0058959 A1 | | 3/2003 | Rafie et al. | 375/296 |
| 2003/0092397 A1 | * | 5/2003 | Uriu et al. | 455/82 |
| 2003/0103579 A1 | | 6/2003 | Webster et al. | 375/298 |
| 2004/0087280 A1 | * | 5/2004 | Watanabe et al. | 455/83 |
| 2004/0185795 A1 | * | 9/2004 | Shamsaifar et al. | 455/83 |
| 2004/0219891 A1 | * | 11/2004 | Hadjichristos | 455/102 |
| 2005/0026647 A1 | * | 2/2005 | Li et al. | 455/552.1 |
| 2005/0186920 A1 | * | 8/2005 | Staszewski et al. | 455/114.1 |
| 2006/0068726 A1 | * | 3/2006 | Yamawaki | 455/114.2 |

\* cited by examiner

*Primary Examiner*—Lana Le
(74) *Attorney, Agent, or Firm*—Steve Mendelsohn (57) ABSTRACT

A radio transmitter for transmitting signals in a predetermined frequency band has a transmit filter and a compensating filter. The transmit filter filters a signal to be transmitted from the transmitter to suppress the transmission of parts of the signal outside the band. The compensating filter, e.g., operating in the digital domain, filters the signal upstream from the transmit filter, wherein the compensating filter is arranged to alter the signal to counteract at least one of a phase ripple, an amplitude ripple, and a group delay variation of the transmit filter within the band.

20 Claims, 5 Drawing Sheets

COMPENSATION OF FILTERS IN RADIO TRANSMITTERS

FIELD OF THE INVENTION

The invention relates to radio transmitters such as may be used in base stations of cellular wireless-communications networks.

DESCRIPTION OF RELATED ART

In practice, a base station will be subject to a limitation on the range of frequencies that it emits, for example for the purpose of preventing the base station interfering with the operation of neighbouring equipment. To realise this limitation, a base station usually includes a transmit filter for suppressing, in an RF signal to be transmitted, any frequencies that lie outside the frequency band designated for transmissions from the base station.

BRIEF DESCRIPTION OF THE DRAWINGS

By way of example only, some embodiments of the invention will now be described with reference to the accompanying drawings, in which.

DETAILED DESCRIPTION OF THE PREFERRED EMBODIMENTS

According to one aspect, the invention provides a radio transmitter for transmitting signals in a designated frequency band, comprising a transmit filter for filtering a signal to be transmitted from the transmitter in order to suppress the transmission of parts of the signal that lie outside the band and a compensating filter, which operates in the digital domain, for filtering said signal upstream from the transmit filter. The compensating filter is arranged to alter the signal to counteract one or more of phase ripple, amplitude ripple, and group delay variation within the pass-band and/or transition band of the transmit filter.

Figure 1:
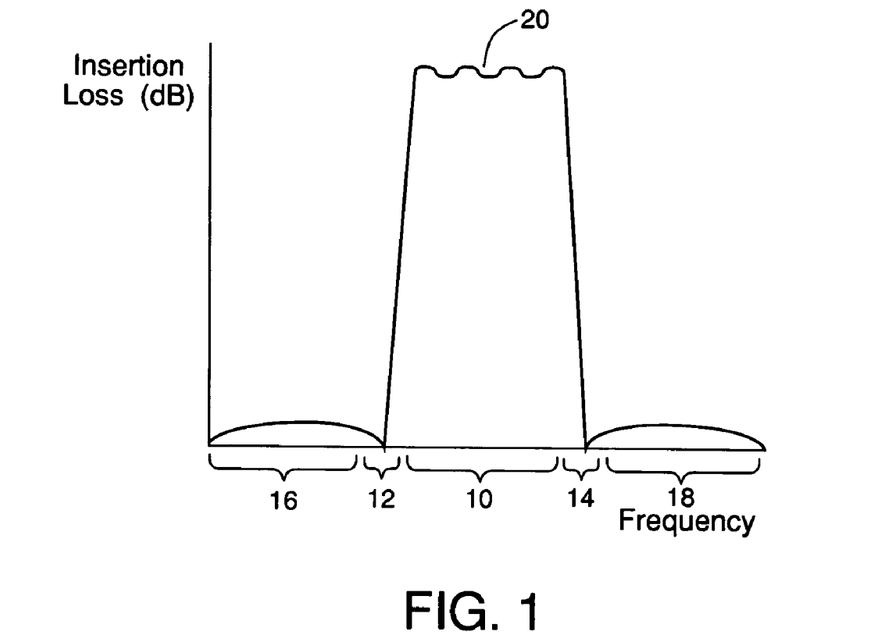
FIG. 1 is a diagram of the amplitude characteristic of a transmit filter in an RF transmitter.

FIG. 1 shows a plot of the insertion loss (in dB) versus frequency for a typical transmit filter in a base station. This plot shows how the transmit filter will attenuate signals passing through it. The plot in FIG. 1 shows a pass-band 10, in which frequencies passing through the filters are not substantially attenuated. The pass-band is bounded at either side by transition bands 12 and 14, which lead into stop bands 16 and 18 in which frequencies experience large amounts of attenuation. The transmit filter is designed so that the pass-band 10 extends over just the range of frequencies that the transmitter is designed to emit. It will be note that the attenuation varies slightly with frequency within the pass-band and this variation is known as amplitude ripple. The amplitude ripple is indicated 20 in FIG. 1.

The phase characteristics of the filter described with reference to FIG. 1 will exhibit a phase ripple similar to the amplitude ripple of FIG. 1.

Figure 2:
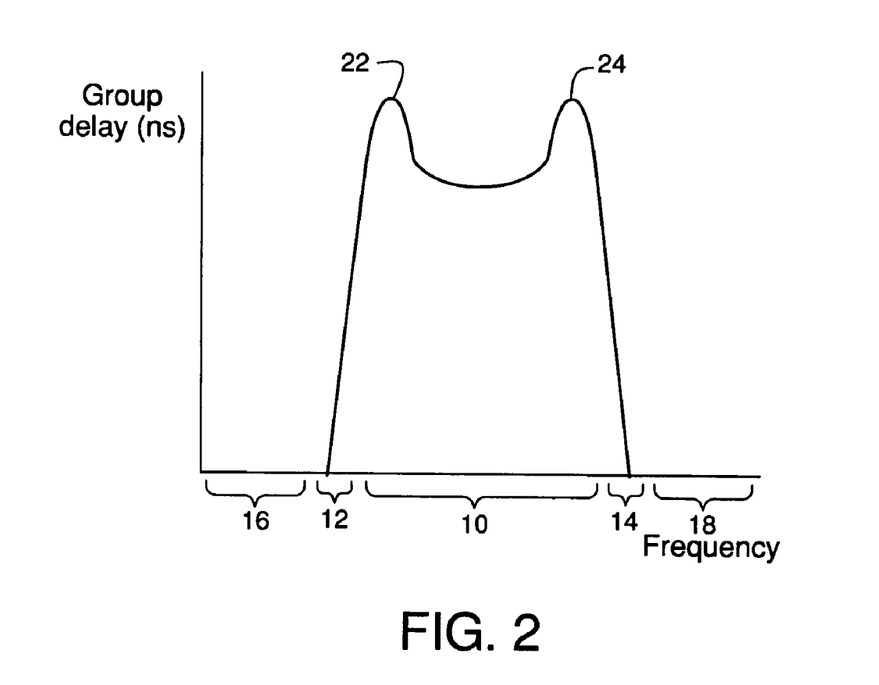
FIG. 2 is a diagram of the group delay characteristic of the filter described with reference to FIG. 1.

FIG. 2 is a plot of the group delay (in ns) versus frequency for the filter described with reference to FIG. 1. Towards the centre of the pass-band 10, the group delay is more or less constant but as one moves into the transition bands 12 and 14, the group delay changes rapidly with frequency and the curve exhibits a pair of "ears" 22 and 24 in the transition bands.

The amplitude and phase ripples and group delay variation in the pass-band all contribute to error vector magnitude (EVM). EVM is a measure of the deviation of the actual position of the signal in quadrature phase space at a given time from its desired position. In one respect, EVM is a measure of the quality of the transmitter. The design of the transmit filter will affect the EVM of the transmitter. The EVM can be reduced by carefully designing the transmit filter to exhibit less group delay variation and ripple (whether amplitude or phase) in its pass-band. However, this typically leads to an increase in the sophistication of the design of the filter, which, in turn, leads to increased cost. Sometimes, it is desirable to provide the filter with very steep transition bands in order to provide a very precise pass-band for the transmit filter. However, the steepness of the transition bands is normally linked to the degree of ripple and group delay variation in the pass-band such that steepening the transition bands increases the amount of ripple and group delay variation in the pass-band, for a given degree of filter complexity.

The invention provides a way of compensating for pass-band ripples and pass-band group delay variations. This may permit, on the one hand, the use of lower cost designs for the transmit filter and, on the other hand, the use of transmit filter designs with steep transition bands.

Typically, the radio transmitter will include a power amplifier for boosting a signal that is intended for transmission to ensure that receivers, such as mobile telephones, in the vicinity of the radio transmitter have a good prospect of successfully receiving the signal. A lineariser can be provided for counteracting distortion, such as intermodulation distortion, introduced by the power amplifier to the signal that is being amplified. Such a lineariser can be, for example, a predistorter that introduces a deliberate error into a signal to be amplified by the power amplifier such that the distorting effect of the power amplifier itself is expended in undoing the error introduced by the predistorter. It is possible to make a lineariser adaptive such that it senses the output of the power amplifier in order to detect the presence of any residual distortion in the power amplifier output signal to adjust the lineariser to eliminate the residual distortion. In addition to counteracting the distorting effect of the power amplifier, a lineariser can also suppress distortion caused by the transmit filter. For example, a lineariser could counteract intermodulation distortion introduced within the hardware of the transmit filter.

In a manner similar to a lineariser, the compensation filter can also be made adaptive. For this purpose, the transmitter can be provided with a processing arrangement which compares two versions of a signal to be transmitted, one taken from a point upstream from the transmit filter and the other taken from a point downstream from the transmit filter. From such a comparison, it is possible to determine if the compensating filter is accurately suppressing transmitter output variations caused by one or more of phase ripple, amplitude ripple, and group delay variation within the pass-band of the transmit filter. If necessary, the digitally implemented compensation filter can then be adjusted in an adaptive fashion to optimise the suppression of signal distortion arising from pass-band ripples and pass-band group delay variation.

Where the compensating filter is adaptive and is used in conjunction with an adaptive lineariser, it is possible to use components provided for sampling the signal to be transmitted in order to provide information for the adaption of both the lineariser and the compensating filter.

In one embodiment of such a system, a signal to be transmitted is sensed downstream from the amplifier at one of two points, one point being upstream from the transmit filter and one point being downstream from the transmit filter. The point at which the signal to be transmitted is sensed is selected by a switch. One advantage of this arrangement is that the lineariser can be adapted on the basis of information obtained when the transmit filter is by-passed since the transmit filter may distort the picture of residual distortion in the power amplifier output leading, in turn, to sub-optimal operation of the lineariser.

In another such embodiment, the signal to be transmitted is sensed at a point downstream from both the power amplifier and the transmit filter. When the information gathered by this path is required for use by the lineariser, then a correction is applied to counteract the distortion by the transmit filter of residual distortion caused by the amplifier.

In some embodiments, the transmitter can be part of a transmitter-receiver containing both a transmit stage and a receive stage connected to a common antenna through a diplexer in which the transmit filter is located. As before, the transmit filter is corrected by the compensating filter.

The transmitter is preferably part of a base station in a cellular wireless-communications network, such as a UMTS (Universal Mobile Telecommunications System) network. Alternatively, the transmitter could be part of, for example, a mobile telephone.

Figure 3:
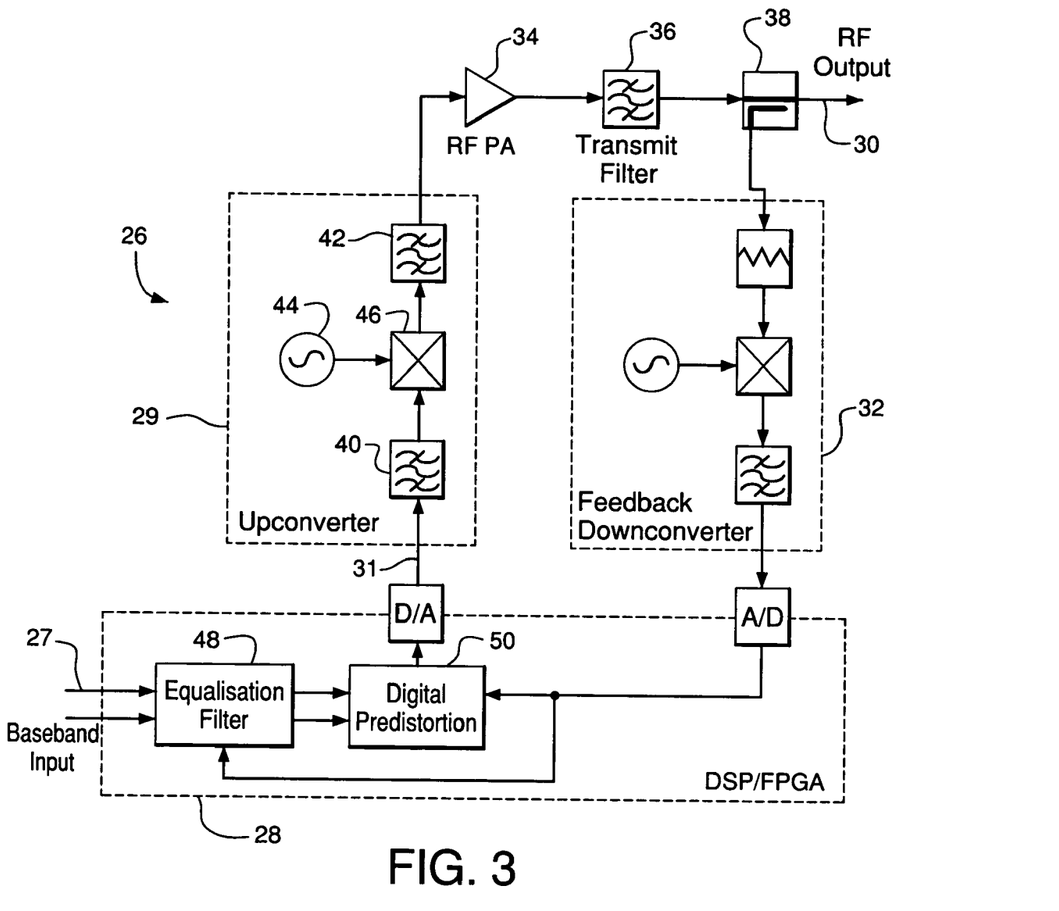
FIG. 3 is a block diagram of an RF transmitter.

FIG. 3 shows an RF transmitter 26 forming part of a base station (not shown) of a cellular telecommunications network. The RF transmitter 26 receives a base band input 27, representing information that is to be transmitted, and produces an RF output 30 modulated with the information from the base band input 27 and destined for transmission from an antenna (not shown). The RF transmitter 26 comprises a digital processing unit (DPU) 28, an upconverter 29, a downconverter 32, an RF power amplifier (RFPA) 34, a transmit filter 36, and a coupler 38. Parts of the transmitter that are not necessary for understanding the invention and which are well known to persons skilled in this art are not shown in FIG. 3 and are not described in detail below. Equivalent statements apply in respect of FIGS. 5, 6, and 7.

Returning to FIG. 3, the DPU 28 modifies the base band input 27 (in a manner to be described later) and supplies the modified base band input 31 to the upconverter 29. The modified base band input 31 supplied to the upconverter 29 will comprise a band of frequencies and the upconverter 29 performs a frequency upconversion on the modified base band input 31 by shifting the band of frequencies in the modified base band input 31 to a desired part of the RF range. The upconverter 29 is of known design and its main components are two filters 40 and 42, a local oscillator (LO) 44, and a mixer 46. To describe the operation of the upconverter briefly, the LO 44 produces an RF signal that is mixed with the modified base band input 31 at mixer 46 to produce the upconverted RF version of the modified base band input 31.

The RF output of the upconverter 29 is supplied to the RFPA 34 where the signal is amplified to boost its power in preparation for transmission from the antenna (not shown) of the transmitter 26. The amplified RF signal produced by the RFPA 34 is filtered by transmit filter 36 and then supplied to the antenna (not shown) of the transmitter 26. The purpose of the transmit filter 36 is to suppress, as far as possible, any signal energy in the output of the RFPA 34 that lies outside the RF frequency band that has been designated for use by the RF transmitter 26.

The output of the transmit filter 36 is sampled at a coupler 38 and is supplied to the DPU 28 via a downconverter 32. The purpose of the downconverter 32 is to frequency downconvert the band of frequencies contained in the output of the transmit filter 36 to base band for use by the DPU 28. The downconverter 32 is of known design and performs its frequency translation in much the same way as upconverter 29. The DPU 28 uses the feedback supplied from the output of transmit filter 36 by coupler 38 to control the correction of errors in the RF output 30 due, in the main part, to the RFPA 34 and the transmit filter 36.

The DPU 28 is a digital signal processor (DSP). In other embodiments, the DPU 28 could be a field programmable gate array (FPGA) or an application specific integrated circuit (ASIC). The DPU 28 could even comprise two or more of an ASIC, a DSP, and an FPGA working together. From the perspective of the invention, the two main processes performed by the DPU 28 on the base band input 27 are an equalisation filtering algorithm 48 and a predistortion algorithm 50.

The predistortion algorithm 50 is a type of lineariser that modifies the base band input 27 to counteract distortion produced by the RFPA 34. In its output, the RFPA 34 will tend to create intermodulation distortion (IMD), arising from undesired mixing between the frequencies present within the input to the RFPA 34. The digital predistortion algorithm 50 distorts the base band input 27 in such a way as to counteract the distortion that the RFPA will introduce to the RF output 30. The predistortion algorithm 50 is adaptive and responds to the feedback from coupler 38 to adjust the degree of predistortion applied to the base band input 27 in order to minimise the distortion caused to the RF output 30 by the RFPA 34. Digital predistortion algorithms are known and an example can be found in International patent application no. WO 01/03287 A1, now assigned to Andrew Corporation.

The equalisation filtering algorithm 48 is a compensating filter that addresses errors introduced by the transmit filter 36. As mentioned earlier, the transmit filter 36 is, in practice, subject to pass-band ripples in both the amplitude and phase domains and also suffers from variations in group delay across its pass-band. The equalisation filtering algorithm 48 ameliorates these problems associated with the pass-band in a manner that will be described now with reference to FIG. 4.

Figure 4:
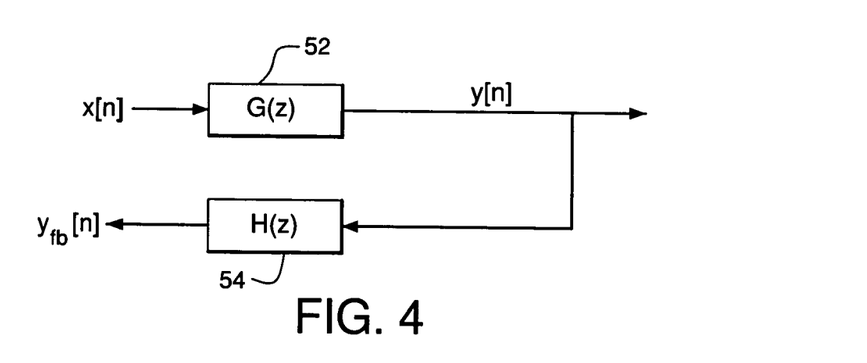
FIG. 4 is a diagram of a transmitter and receiver model.

The loop from the DPU 28 to the transmit filter 36 and back can be represented using the model shown in FIG. 4. The base band input 27 is represented as a signal x comprising a series of samples x[n], where n=0, 1, 2, 3, etc., and is an index representing time. A filter 52 with a transfer function G(z) represents the equalisation filtering algorithm 48, the predistortion algorithm 50, the upconverter 29, the RFPA 34, and the transmit filter 36. The filter 52 receives the signal x and outputs a signal y (likewise comprising a sequence of samples, y[n]) that represents the RF output 30. The model includes another filter 54, which represents the downconverter 32. The filter 54 has a transfer function H(z)

and its input is signal y and it produces an output signal $y_{fb}$ (likewise comprising a set of samples $y_{fb}[n]$) representing the signal acquired by the DPU 28 from the downconverter 32.

It can be assumed that the frequency response of the downconverter 32 is uniform over the range of frequencies present in the signal returned from coupler 38 to the DPU 28 and hence it is permissible to set H(z)=1 in the model. Therefore, with regard to control of the equalisation filtering algorithm 48, the aim of the DPU 28 is to adjust the filtering algorithm 48 to make G(z)=1 also, which condition equates to a minimisation of ripple and group delay variation in the pass-band of the transmit filter 36. Accordingly, the DPU 28 needs to estimate G(z). In order to do this, the DPU 28 assumes that the filter 52 in the model is a finite impulse response (FIR) filter with an impulse response g (comprising a series of samples). For a trial solution $\hat{g}$ for g, the adequacy of the trial solution can be assessed by examining the differences between the signal $y_{fb}$ and the result of convolving signal x with the trial solution $\hat{g}$. This assessment can be made by determining the estimation value E of the function $F=[y_{fb}-(xY\hat{g})]^2$ where Y denotes the convolution operator and where the averaging is performed over a range of values of n.

A series of values for x and $y_{fb}$ can be acquired from the baseband input 27 and the downconverter output, respectively, and placed into the equation for calculating E. The differential dE/dg is then calculated and set equal to zero to find a solution $\hat{g}_{min}$ for $\hat{g}$ that minimises E. The solution $\hat{g}_{min}$ is the version of the impulse response $\hat{g}$ that most closely approximates to G(z). Further information about the deduction of $\hat{g}_{min}$ can be found in "Adaptive Filter Theory", pp 890–898, Simon Haykin, Prentice Hall, 1996, the teachings of which are incorporated herein by reference. [REF. 1]

Once the DPU 28 has arrived at a solution $\hat{g}_{min}$ for G(z), the DPU 28 can estimate departures from G(z)=1 and adjust the equalisation algorithm 48 to cause $\hat{g}_{min}$ to converge on the state G(z)=1. A wide range of known mechanisms exists for the purpose of directing the adjustment of the equalisation algorithm 48 on the basis of the discrepancy between G(z)=1 and $\hat{g}_{min}$, for example, using matrix transposition, as described in [REF. 1].

In controlling the equaliser algorithm 48 to steer G(z) to 1, the DPU 28 minimises phase and amplitude ripples and group delay variation in the pass-band and the transition bands of the transmit filter 36.

As described above, DPU 28 functions as both (i) an assessor that compares the signal upstream from the transmit filter with the signal downstream from the transmit filter in order to provide an indication of residue of at least one of phase ripple, amplitude ripple, and group delay variation within said band and (ii) a controller that adjusts the equalisation filter, under the guidance of the assessment performed by the assessor, to reduce the residue.

Some further embodiments of the invention will now be described.

In a variation on the scheme described above with reference to FIG. 3, the DPU 28 does not calculate an estimated impulse response g for an FIR filter representing the transmit-chain. Instead, the DPU 28 uses a fast fourier transformation (FFT) technique to produce a frequency spectrum of each of the base band input 27 and the output of the downconverter 32. By identifying discrepancies in phase and/or amplitude at like frequencies in the two spectra, imperfections in the equalisation filtering algorithm 48 can be detected and, using an appropriate control algorithm, appropriate changes can be made to the equalisation filtering algorithm 48 to minimise those imperfections.

Figure 5:
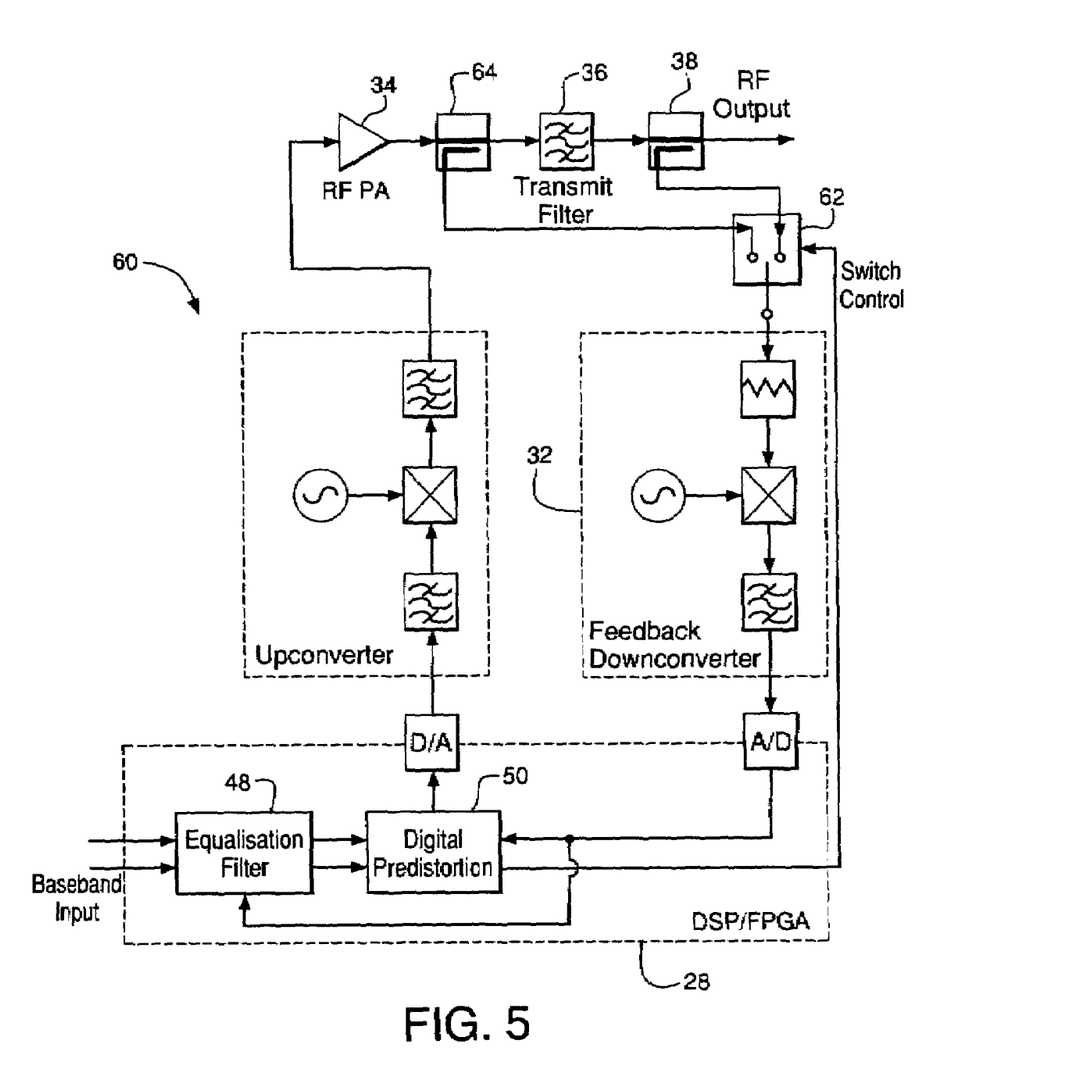
FIG. 5 is a block diagram of another RF transmitter.
Figure 6:
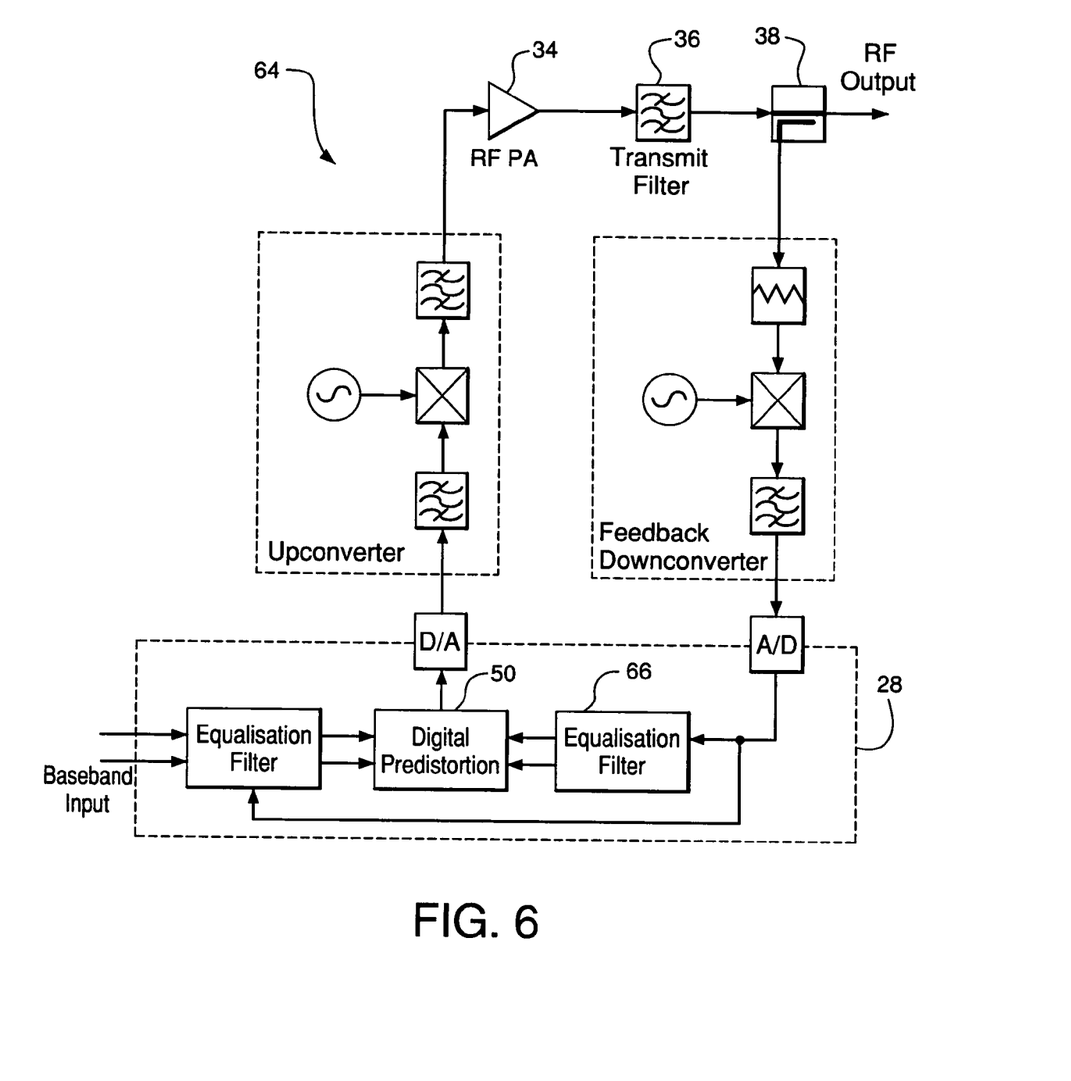
FIG. 6 is a block diagram of yet another RF transmitter.
Figure 7:
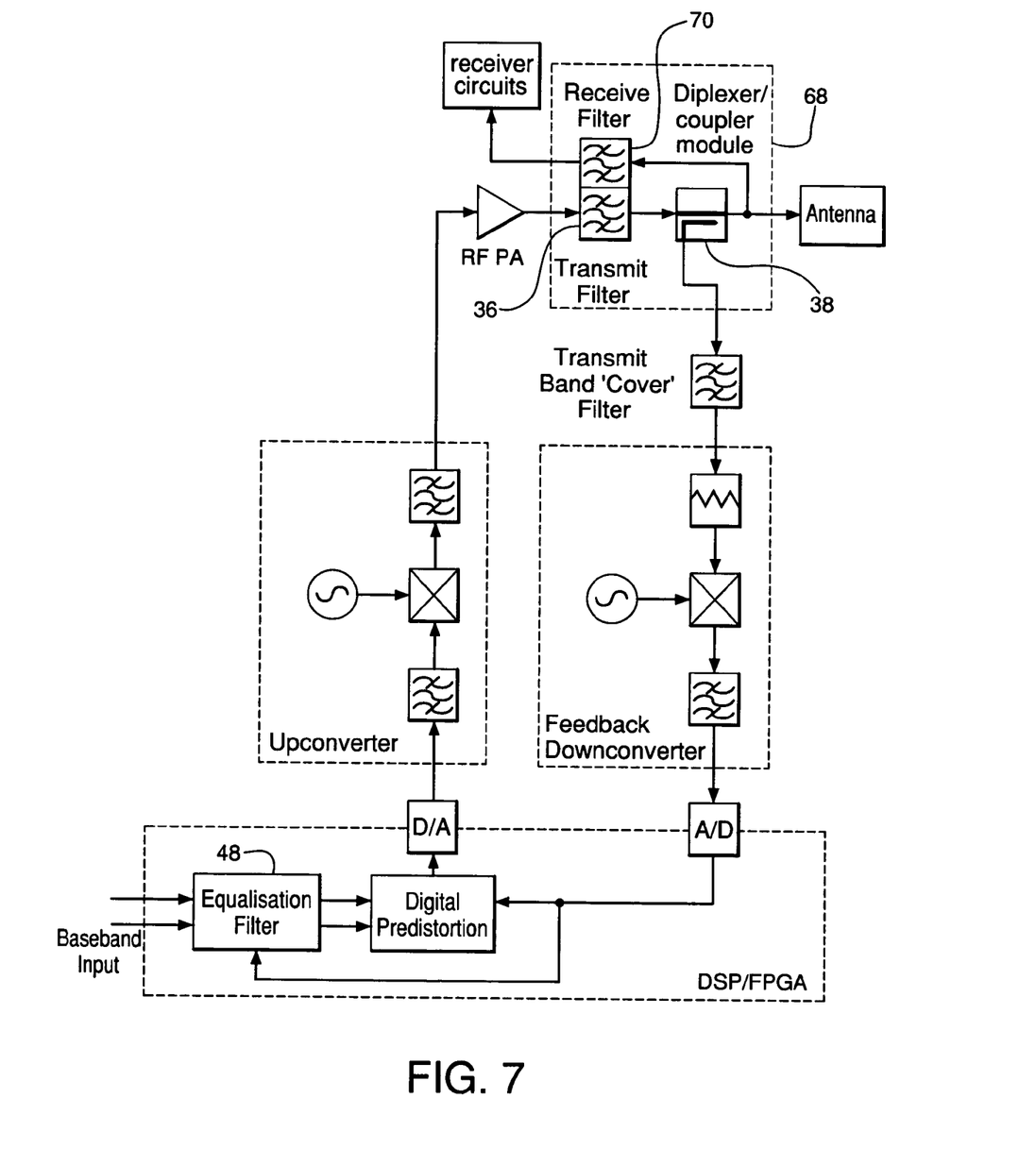
FIG. 7 is a block diagram of the transmitter facet of an RF transmitter-receiver.

FIGS. 5, 6, and 7 show further embodiments that are somewhat similar to that of FIG. 3. In each of FIGS. 5 to 7, elements in common with FIG. 3 retain the same reference numerals and will not be described in detail again.

In certain circumstances, it may be undesirable to control the digital predistortion algorithm 50 on the basis of feedback obtained from coupler 38. This is because the signal obtained by the DPU 28 through coupler 38 has been modified by the transmit filter 36 and might not contain an accurate picture of the spectrum of residual distortion in the output of RFPA 34. That is to say, the distortion spectrum of the RFPA 34 may be significantly distorted by the action of the transmit filter 36. For example, the transmit filter 36 might significantly suppress one IMD side band of the signal being amplified with respect to the other IMD side band.

FIG. 5 shows an RF transmitter 60, which, in most respects, operates in the same manner as transmitter 26. In FIG. 5, a switch 62 is provided between coupler 38 and downconverter 32. A further coupler 64 is provided between the RFPA 34 and the transmit filter 36. Switch 62 allows the DPU 28 to selectively sample either the output of the RFPA 34 (at coupler 64) or the output of the transmit filter 36 (at coupler 38). The operation of the switch is controlled by the DPU 28.

As mentioned above, the digital predistortion algorithm 50 might not obtain a true picture of the residual distortion appearing in the output of RFPA by monitoring a signal returned through coupler 38. Therefore, when the DPU 28 is to adapt the digital predistortion algorithm 50 on the basis of feedback from the RFPA 34, the switch 62 is controlled to connect the DPU 28 to coupler 64 so that the transmit filter 36 is by-passed in the feedback arrangement so that the transmit filter 36 does not bias the spectrum of the distortion that is created by the amplifier 34. When the DPU 28 is to adapt the equalisation filtering algorithm 48, the DPU 28 controls the switch 62 to connect the DPU 28 to coupler 38 so that the feedback signal acquired by the DPU 28 contains information about the affect of the transmit filter 36 and the effectiveness of the equalisation filter 48.

In operation, the switch 62 is usually set to connect coupler 64 to the DPU 28 for adaption of the predistortion algorithm 50. The switch 62 is occasionally switched over to coupler 38 to allow the equalisation filtering algorithm 48 to be updated. Generally, the equalisation filtering algorithm needs to be updated much less frequently than the digital predistortion algorithm 50 because the properties of the transmit filter 36 change only slowly over time (e.g., due to temperature changes).

FIG. 6 shows another variation of the embodiment of FIG. 3. Like the embodiment of FIG. 5, the embodiment of FIG. 6 is adapted to address the problem of the distortion by the transmit filter 36 of the distortion spectrum of the RFPA 34. Instead of using a switch for by-passing the transmit filter 36, the RF transmitter 64 of FIG. 6 uses a further equalisation filtering algorithm 66 in the DPU 28. The second equalisation filtering algorithm 66 is a correcting filter that corrects the feedback signal as used by the digital predistortion algorithm 50 to compensate for the alteration of the distortion spectrum of the RFPA 34 resulting, e.g., from the effect of roll-off in the characteristic of the transmit filter 36.

If desirable, the second equalisation filter 66 can be rendered adaptive based on a sounding signal generated by the DPU 28. The sounding signal is periodically sent through the loop comprising the upconverter 29, the RFPA 34, the transmit filter 36, and the downconverter 32. The DPU 28 monitors the returning sounding signal for changes in the filter centre frequency and/or bandwidth and adjusts the second equalisation filtering algorithm 66 as necessary to counteract such changes.

FIG. 7 demonstrates how the architecture of FIG. 3 can be incorporated into an RF transmitter-receiver. In FIG. 7, the transmit filter 36 and the coupler 38 form part of a diplexer module 68. The diplexer module 68 also includes a receive filter 70 connected to the antenna path for isolating signals received at the antenna for use by the receiver circuits of the transmit-receiver of FIG. 7. The purpose of the receive filter 70 is to isolate signals with frequencies that fall within the band that has been allocated to the transmitter-receiver for signal reception. In the embodiment of FIG. 7, the equalisation filter 48 functions to correct for group delay variations and ripples in the pass-band of the transmit filter 36 of the diplexer 68.

Although the present invention has been described in the context of an amplifier system that relies on pre-distortion to compensate for amplifier distortion, the invention can also be implemented in the context of amplifier systems that utilize feed-forward compensation schemes in addition to or instead of pre-distortion.

Although the present invention has been described in the context of implementations involving a processing unit (i.e., DPU 28) that operates in the digital domain on base band signals, the invention is not so limited. In alternative embodiments, a processing unit may operate (1) in the digital domain on signals other than base band signals, such low digital IF signals, or (2) in the analog domain.

The present invention may be implemented in the context of wireless signals transmitted from a base station to one or more mobile units of a wireless communication network. In theory, embodiments of the present invention could be implemented for wireless signals transmitted from a mobile unit to one or more base stations. The present invention can also be implemented in the context of other wireless and even wired communication networks to reduce spurious emissions.

Embodiments of the present invention may be implemented as circuit-based processes, including possible implementation on a single integrated circuit (such as an ASIC or an FPGA), a multi-chip module, a single card, or a multi-card circuit pack. As would be apparent to one skilled in the art, various functions of circuit elements may also be implemented as processing steps in a software program. Such software may be employed in, for example, a digital signal processor, micro-controller, or general-purpose computer.

It will be further understood that various changes in the details, materials, and arrangements of the parts which have been described and illustrated in order to explain the nature of this invention may be made by those skilled in the art without departing from the scope of the invention as expressed in the following claims.

I claim:

1. Apparatus for generating a transmission signal in a frequency band, the apparatus comprising:
   a compensating filter;
   an amplifier connected downstream of the compensating filter;
   a transmit filter connected downstream of the amplifier, wherein:
      the amplifier is adapted to amplify an outgoing signal;
      the transmit filter is adapted to filter the amplified outgoing signal to suppress pans of the amplified outgoing signal outside of the band for the transmission signal; and
      the compensating filter is adapted to alter the outgoing signal to reduce one or more features generated by the transmit filter within the band in the transmission signal;
   a first sampler connected downstream of the transmit filter and adapted to sample the transmission signal generated by the transmit filter to generate a first feedback signal prior to transmission of the transmission signal; and
   a feedback path connected between the first sampler and the compensating filter and adapted to provide the first feedback signal to the compensating filter, wherein:
      the compensating filter is adapted to alter the outgoing signal to reduce the one or more features based on the first feedback signal.

2. The invention of claim 1, wherein:
the compensating filter is adapted to operate at baseband;
the amplifier and the transmit filter are adapted to operate at a non-baseband transmission frequency;
the apparatus further comprises:
   an upconverter connected between the compensating filter and the amplifier and adapted to convert the outgoing signal from baseband to the transmission frequency; and
   a downconverter connected between the first sampler and the compensating filter in the feedback path and adapted to convert the first feedback signal from the transmission frequency to baseband.

3. The invention of claim 1, further comprising a linearizer connected upstream of the amplifier and adapted to predistort the outgoing signal to reduce distortion introduced into the transmission signal by the amplifier.

4. The invention of claim 3, wherein the linearizer is connected to receive the first feedback signal and adapted to predistort the outgoing signal to reduce distortion introduced into the transmission signal by the amplifier and by the transmit filter.

5. The invention of claim 3, further comprising:
   a second sampler connected between the amplifier and the transmit filter and adapted to sample the amplified outgoing signal to generate a second feedback signal;
   a switch connected to receive the first and second feedback signals and adapted to provide a selected one of the first and second feedback signals to the linearizer and to the compensating filter.

6. The invention of claim 3, further comprising a correcting filter connected to receive the first feedback signal and adapted to correct the first feedback signal as used by the linearizer for a roll-off effect in the characteristic of the transmit filter.

7. The invention of claim 1, further comprising a transmit band cover filter connected in the feedback path between the first sampler and the compensating filter.

8. The invention of claim 1, wherein the one or more features comprise at least one of a phase ripple, an amplitude ripple, and a group delay variation of the transmit filter within the band.

9. The invention of claim 8, wherein the one or more features comprise the phase ripple of the transmit filter within the band.

10. The invention of claim 8, wherein the one or more features comprise the amplitude ripple of the transmit filter within the band.

11. The invention of claim 8, wherein the one or more features comprise the group delay variation of the transmit filter within the band.

12. The invention of claim 8, wherein the one or more features comprise at least two of the phase ripple, the amplitude ripple, and the group delay variation of the transmit filter within the band.

13. The invention of claim 12, wherein the one or more features comprise the phase ripple, the amplitude ripple, and the group delay variation of the transmit filter within the band.

14. The invention of claim 1, further comprising:
- an antenna connected downstream of the transmit filter and adapted to transmit the transmission signal from the apparatus and receive a received signal transmitted to the apparatus;
- receiver circuitry adapted to process the received signal; and
- a diplexer connected to allow the transmission signal to pass from the transmit filter to the antenna and the received signal to pass from the antenna to the receiver circuitry.

15. A method for generating a transmission signal in a frequency band, the method comprising:
- amplifying an outgoing signal;
- transmit filtering the amplified outgoing signal to suppress parts of the amplified outgoing signal outside of the band for the transmission signal;
- sampling the transmission signal to generate a feedback signal prior to transmission of the transmission signal; and
- altering the outgoing signal using a compensating filter based on the feedback signal, prior to amplifying the outgoing signal, using a compensating filter to reduce one or more features generated by the transmit filtering within the band in the transmission signal.

16. The invention of claim 15, wherein the one or more features comprise at least one of a phase ripple, an amplitude ripple, and a group delay variation of the transmit filter within the band.

17. The invention of claim 15, further comprising predistorting the outgoing signal based on the feedback signal, prior to amplifying the outgoing signal, to reduce distortion introduced into the transmission signal by the amplifying and the transmit filtering.

18. Apparatus for generating a transmission signal in a frequency band, the apparatus comprising:
- means for amplifying an outgoing signal;
- means for transmit filtering the amplified outgoing signal to suppress pans of the amplified outgoing signal outside of the band for the transmission signal;
- means for sampling the transmission signal to generate a feedback signal prior to transmission of the transmission signal; and
- means for compensation filtering to alter the outgoing signal based on the feedback signal, prior to amplifying the outgoing signal, to reduce one or more features generated by the transmit filtering within the band in the transmission signal.

19. The invention of claim 18, wherein the one or more features comprise at least one of a phase ripple, an amplitude ripple, and a group delay variation of the transmit filter within the band.

20. The invention of claim 18, further comprising means for predistorting the outgoing signal based on the feedback signal, prior to amplifying the outgoing signal, to reduce distortion introduced into the transmission signal by the means for amplifying and the means for transmit filtering.

* * * * *

UNITED STATES PATENT AND TRADEMARK OFFICE
CERTIFICATE OF CORRECTION

PATENT NO. : 7,149,482 B2  Page 1 of 1
APPLICATION NO. : 10/663100
DATED : December 12, 2006
INVENTOR(S) : Peter Blakeborough Kenington It is certified that error appears in the above-identified patent and that said Letters Patent is hereby corrected as shown below:

Column 7, line 65, replace "pans" with --parts--.
Column 10, line 14 replace "pans" with --parts--.

Signed and Sealed this

Twenty-seventh Day of February, 2007

JON W. DUDAS
*Director of the United States Patent and Trademark Office*